United States Patent
Lamson et al.

(10) Patent No.: US 6,794,743 B1
(45) Date of Patent: Sep. 21, 2004

(54) STRUCTURE AND METHOD OF HIGH PERFORMANCE TWO LAYER BALL GRID ARRAY SUBSTRATE

(75) Inventors: Michael A. Lamson, Westminster, TX (US); Navinchandra Kalidas, Houston, TX (US)

(73) Assignee: Texas Instruments Incorporated, Dallas, TX (US)

( * ) Notice: Subject to any disclaimer, the term of this patent is extended or adjusted under 35 U.S.C. 154(b) by 203 days.

(21) Appl. No.: 09/631,198

(22) Filed: Aug. 3, 2000

Related U.S. Application Data

(60) Provisional application No. 60/147,596, filed on Aug. 6, 1999.

(51) Int. Cl.⁷ .......................... H01L 23/52; H01L 23/04
(52) U.S. Cl. ...................... 257/691; 257/698; 257/700; 257/737; 257/738; 257/778
(58) Field of Search .............................. 257/759, 688, 257/689, 691, 698, 700, 737, 738, 780, 778, 712, 666, 669, 674, 758, 670, 697; 361/704, 690, 711, 719

(56) References Cited

U.S. PATENT DOCUMENTS

| | | | |
|---|---|---|---|
| 4,617,586 A | * 10/1986 | Cuvilliers et al. | |
| 5,055,704 A | * 10/1991 | Link et al. | |
| 5,497,030 A | * 3/1996 | Takeuchi | 257/676 |
| 5,710,071 A | * 1/1998 | Beddingfield et al. | |
| 5,877,548 A | * 3/1999 | Washida et al. | 257/690 |
| 6,104,093 A | * 8/2000 | Caletka et al. | |
| 6,137,159 A | * 10/2000 | Tsubosaki et al. | 257/666 |
| 6,160,705 A | * 12/2000 | Stearns et al. | |
| 6,228,680 B1 | * 5/2001 | Thomas | |
| 6,259,587 B1 | * 7/2001 | Sheldon et al. | |
| 6,396,136 B2 | * 5/2002 | Kalidas et al. | |
| 6,407,432 B1 | * 6/2002 | Nemoto et al. | |

* cited by examiner

*Primary Examiner*—Long Pham
*Assistant Examiner*—Dilinh Nguyen
(74) *Attorney, Agent, or Firm*—Wade James Brady, III; Frederick J. Telecky, Jr.

(57) ABSTRACT

A high-performance, high I/O ball grid array substrate, designed for integrated circuit flip-chip assembly and having two patterned metal layers, comprising: an insulating layer having a first surface, a second surface and a plurality of vias filled with metal. Said first surface having one of said metal layers attached to provide electrical ground potential, and having a plurality of electrically insulated openings for outside electrical contacts. An outermost insulating film protecting the exposed surface of said ground layer, said film having a plurality of openings filled with metal suitable for solder ball attachment. Said second surface having the other of said metal layers attached, portions thereof being configured as a plurality of electrical signal lines, further portions as a plurality of first electrical power lines, and further portions as a plurality of second electrical power lines, selected signal and power lines being in contact with said vias. Said signal lines being distributed relative to said first power lines such that the inductive coupling between them reaches at least a minimum value, providing high mutual inductances and minimized effective self-inductance. Said signal lines further being electromagnetically coupled to said ground metal such that cross talk between signal lines is minimized. And an outermost insulating film protecting the exposed surfaces of said signal and power lines, said film having a plurality of openings filled with metal suitable for contacting selected signal and power lines and chip solder bumps.

27 Claims, 5 Drawing Sheets

STRUCTURE AND METHOD OF HIGH PERFORMANCE TWO LAYER BALL GRID ARRAY SUBSTRATE

This application claims priority under 35 USC § 119 based upon Provisional Patent Application No. 60/147,596, filed Aug. 6, 1999.

FIELD OF THE INVENTION

The present invention is related in general to the field of semiconductor devices and processes and more specifically to structure, materials and fabrication of high performance plastic ball-grid array packages designed for flip-chip assembly.

DESCRIPTION OF THE RELATED ART

Ball Grid Array (BGA) packages have emerged as an excellent packaging solution for integrated circuit (IC) chips with high input/output (I/O) count. BGA packages use sturdy solder balls for surface mount connection to the "outside world" (typically plastic circuit boards, PCB) rather sensitive package leads, as in Quad Flat Packs (QFP), Small Outline Packages (SOP), or Tape Carrier Packages (TCP). Some BGA advantages include ease of assembly, use of surface mount process, low failure rate in PCB attach, economic use of board area, and robustness under environmental stress. The latter used to be true only for ceramic BGA packages, but has been validated in the last few years even for plastic BGAs. From the standpoint of high quality and reliability in PCB attach, BGA packages lend themselves much more readily to a six-sigma failure rate fabrication strategy than conventional devices with leads to be soldered.

A BGA package generally includes an IC chip, a multi-layer substrate, and a heat spreader. The chip is generally mounted on the heat spreader using a thermally conductive adhesive, such as an epoxy. The heat spreader provides a low resistance thermal path to dissipate thermal energy, and is thus essential for improved thermal performance during device operation, necessary for consistently good electrical performance. The heat spreader is generally construed of copper and may include gold plating—representing an expensive part of the package. Further, the heat spreader provides structural and mechanical support by acting as a stiffener, adding rigidity to the BGA package, and may thus be referred to as a heat spreader/stiffener.

One of the substrate layers includes a signal "plane" that provides various signal lines, which can be coupled, on one end, to a corresponding chip bond pad using a wire bond (or to a contact pad using flip-chip solder connection). On the other end, the signal lines are coupled with a solder "ball" to other circuitry, generally through a PCB. These solder bails form the array referred to in a BGA. Additionally, a ground plane will generally be included on one of the substrate layers to serve as an active ground plane to improve overall device performance by lowering the inductance, providing controlled impedance, and reducing cross talk. These features become the more important the higher the BGA pin count is.

In contrast to the advantages of the BGA packages, prevailing solutions in BGA packages have lagged in performance characteristics such as power dissipation and the ability to maintain signal integrity in high speed operation necessary for devices such as high speed digital signal processors (DSP) and mixed signal products (MSP) Electrical performance requirements are driving the need to use multi-layer copper-laminated resin substrates (previously ceramic). As clock frequencies and current levels increase in semiconductor devices, the packaging designs are challenged to provide acceptable signal transmission and stable power and ground supplies. Providing stable power is usually achieved by using multiple planes in the package, properly coupled to one another and to the signal traces. In many devices, independent power sources are needed for core operation and for output buffer supply but with a common ground source.

As for higher speeds, flip chip assembly rather than wire bonding has been introduced. Compared to wire bonding within the same package outline, flip chip assembly offers greatly reduced IR drop to the silicon core circuits; significant reduction of power and ground inductances; moderate improvement of signal inductance; moderate difference in peak noise; and moderate reduction in pulse width degradation.

In order to satisfy all these electrical and thermal performance requirements, packages having up to eight metal layers have been introduced. The need, however, of high numbers of layers is contrary to the strong market emphasis on total semiconductor device package cost reduction. This emphasis is driving an ongoing search for simplifications in structure and materials, of course with the constraint that electrical, thermal and mechanical performances should be affected only minimally.

The complexity and cost of the BGA packages are also influenced by the number of interconnections or vias that must be fabricated in the substrate layers to provide a path to connect each of the solder balls to either the ground plane, the power planes, or desired signal lines of the signal plane. Each via requires the formation of an electrically conductive layer on the internal walls of the via, to ensure a complete electrical path. Generally, the metallization of the internal walls of each via increases the overall complexity. Consequently, multiple vias and multiple substrate layers result not only in higher BGA fabrication costs, but also lower yields.

Analyzing the total package cost shows that the cost of the substrate dominates (usually more than 50%), followed by the heat slug (usually at least 30%). In order to reduce the substrate cost, however, the number of layers should be reduced. This approach, in turn, seems to greatly endanger the electrical and thermal package performance.

An urgent need has therefore arisen to break this vicious cycle and conceive a concept for a low-cost, yet high performance BGA package structure. Preferably, this structure should be based on a fundamental design concept flexible enough to be applied for different semiconductor product families and a wide spectrum of design and assembly variations. It should not only meet high electrical and thermal performance requirements, but should also achieve improvements towards the goals of enhanced process yields and device reliability. Preferably, these innovations should be accomplished using the installed equipment base so that no investment in new manufacturing machines is needed.

SUMMARY OF THE INVENTION

According to the present invention, a high-performance, high input/output ball grid array substrate is provided, which is designed for integrated circuit flip-chip assembly and has two patterned metal layers and an intermediate insulating layer.

The insulating layer has a plurality of vias filled with metal, and one of the metal layers attached to each surface.

Positioned between the two metal layers, the insulating layer has a thickness and material characteristics suitable for strong electromagnetic coupling between the signal lines and the first metal layer. In this manner, a predetermined impedance to ground is provided, and cross-talk between signal lines is minimized.

The first metal layer provides the electrical ground potential and has a plurality of electrically insulated openings for outside electrical contacts.

The second metal layer has three portions: The first portion is configured as a plurality of signal lines; the second portion is configured as a plurality of first electrical power lines operable at a first potential; and the third portion is configured as a plurality of second electrical power lines operable at a second potential. The first power lines are configured so wide that their combined inductances approximate the inductance of a metal having the size of the total substrate. The second power lines are configured to serve as distributed areas having wide geometries for minimizing self-inductance and merging into a central area supporting the IC chip.

It is an aspect of the invention that the signal lines are distributed relative to the first power lines such that the inductive coupling between them reaches at least a minimum value, providing high mutual inductances and close to zero effective self-inductance. Further, the signal lines are electromagnetically coupled to the ground metal such that cross-talk between signal lines is minimized.

Another aspect of the invention is to provide an outermost insulating layer protecting the exposed surface of the ground layer. This insulating film has a plurality of openings filled with metal suitable for solder ball attachment.

Another aspect of the invention is to provide another outermost insulating layer protecting the exposed surfaces of the signal and power lines. This insulating film has a plurality of openings filled with metal suitable for contacting selected signal and ground lines and chip solder bumps.

Another aspect of the invention is to provide the modeling guidelines for designing the substrate structures and materials such that they are flexible enough to be applied for different semiconductor high-performance device families and a wide spectrum of high speed, high power design and assembly variations.

Another aspect of the invention is to utilize existing semiconductor fabrication processes and to reach the substrate and device goals without the cost of equipment changes and new capital investment, by using the installed fabrication equipment.

Another aspect of the invention is to reduce the thickness of the BGA substrate substantially so that the BGA device can readily be employed in a variety of new products requiring thin semiconductor components.

Another aspect of the invention is to improve the inherent thermal dissipation to a degree that the use of a heat slug is no longer mandatory to achieve the required thermal characteristics.

These aspects have been achieved by the computer-implemented method for modeling a high-performance, high I/O ball grid array substrate, and by a method for fabricating this substrate for integrated circuit flip-chip assembly, suitable for mass production.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
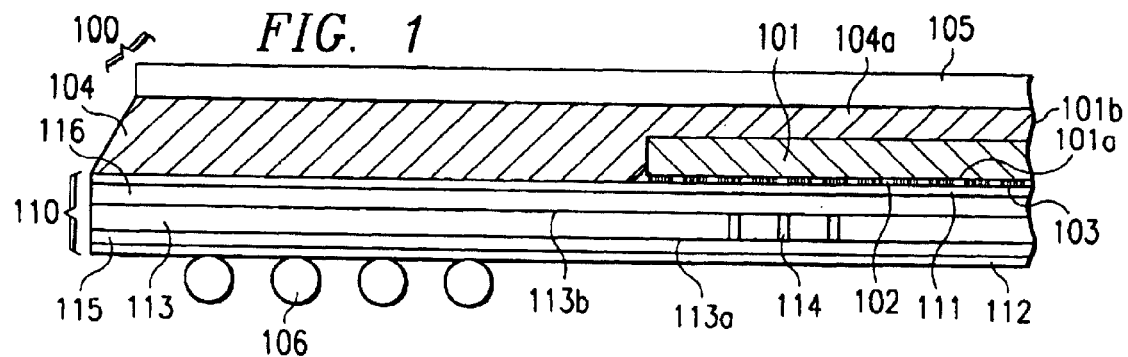
FIG. 1 is a schematic and simplified cross section of the Ball Grid Array device having a substrate according to the invention.

FIG. 1 is a simplified and schematic cross sectional view of a portion of the high-performance, high input/output (I/O) Ball Grid Array (BGA) package of the invention, generally designated 100. Using solder bumps 102 in flip-chip technology, the active surface 101a of the integrated circuit chip 101 is attached to openings in the outermost insulating film 111 of substrate 110, facing the active chip surface 101a. Chip 101 is commonly made of silicon and has a thickness typically in the range of about 200 to 375 $\mu$m. The number of I/O's typically is in the range from about 100 to 600; approximately one half of these I/O's serve signal lines, the other half is dedicated to power and ground potentials.

The solder bumps 102 connecting the chip I/O's to the substrate 110 are usually small in diameter, typically about 100 to 120 $\mu$m with a range of ±10 $\mu$m, and comprise attach materials selected from a group consisting of tin, lead/tin alloys, indium, indium/tin alloys, solder paste, and conductive adhesive compounds. Following the flip-chip attachment, any gaps between chip 101 and substrate 110, and also between the solder bumps 102, are filled with a polymeric encapsulant 103. This encapsulant typically is a polymeric precursor mad of an epoxy base material filled with silica and anhydrides, requiring thermal energy for curing to form a polymeric encapsulant.

The encapsulation material 104, surrounding the chip 101 after flip-chip attachment, serves the protection of the mounted chip. Commonly, it is a polymeric material selected from a group consisting of epoxy-based molding compounds suitable for adhesion to the chip, and fluoro-dielectric compounds supporting high-speed and high-frequency package performance. For molding compounds, standard transfer molding processes are the preferred method of encapsulation in mass fabrication. Over the passive surface 101b of the chip, the molded material 104a may have a thickness typically in the range from 300 to 500 µm, between the substrate and the heat slug from about 500 to 800 µm.

The heat spreader 105, positioned on the outer surface of the encapsulation material 104, is optional. Its thickness is typically in the range from about 150 to 300 µm. It enhances heat spreading and heat dissipation and thus the overall thermal performance of the device significantly, but is usually made of copper and thus a substantial cost contributor. However, based on the outstanding thermal characteristics of the BGA substrate of the present invention, the desired thermal device performance can be achieved even without an additional heat spreader.

Solder balls 106 are attached to the plurality of openings in the outermost insulating film 112 of substrate 110. As defined herein, the term solder "balls" does not imply that the solder contacts are necessarily spherical. They may have various forms, such as semispherical, half-dome, truncated cone, or generally bump. The exact shape is a function of the deposition technique (such as evaporation, plating, or pre-fabricated units) and reflow technique (such as infrared or radiant heat), and the material composition. The solder balls usually have a diameter in the range from about 0.1 to 0.4 mm. Several methods are available to achieve consistency of geometrical shape by controlling amount of material and uniformity of reflow temperature. The solder balls 106 comprise attach materials selected from a group consisting of tin/lead, tin/indium, tin/silver, tin/bismuth, solder paste, and conductive adhesive compounds.

The two outermost insulating films 111 and 112 of the substrate serve as protection for the substrate metal patterns and as solder masks. The films preferably are glass-filled epoxies, polyimides, acrylics or other photo-imageable materials suitable as solder masks in the thickness range from about 50 to 100 µm. The openings for solder bump and solder ball attachments are made of copper including a flash of gold, palladium or platinum, or other wettable and solderable metals.

As FIG. 1 schematically shows, the substrate 110 consists of an insulating layer 113 having a first surface 113a, a second surface 113b, and a plurality of vias 114 filled with metal. The preferred metal is copper, but tungsten or any other electrically conductive materials are suitable. The insulating layer 113 has preferably a thickness in the range from about 70 to 150 µm and is made of organic material selected from a group consisting of polyimide, polymer strengthened by glass fibers, FR-4, FR-5, and BT resin. The dielectric constant is preferably between 4 and 5.

Attached to the first substrate surface 113a is a metal layer 115, configured to provide electrical ground potential. Attached to the second surface 113b is a metal layer 116, configured to provide a plurality of electrical signal lines, further a plurality of first electrical power lines, and further a plurality of second electrical power lines. The total thickness of the substrate 110 is preferably in the range from about 150 to 300 µm.

The two metal layers 115 and 116 have a thickness preferably in the range of about 7 to 15 µm, and are made, for example, of copper, brass, aluminum, silver, or alloys thereof. Metal layer 115, herein called the "first metal layer", is designed to provide the electrical ground potential. It has a plurality of openings, each having an electrically insulated ring and metal in the core for outside electrical contacts. This core metal is solderable and connects to the solder balls 106.

Metal layer 116, herein called the "second metal layer", is designed so that a portion is configured as a plurality of electrical signal lines, a further portion as plurality of first electrical power lines, and a final portion as a plurality of second electrical power lines. These portions are illustrated in more detail in FIGS. 4 to 7.

Figure 2:
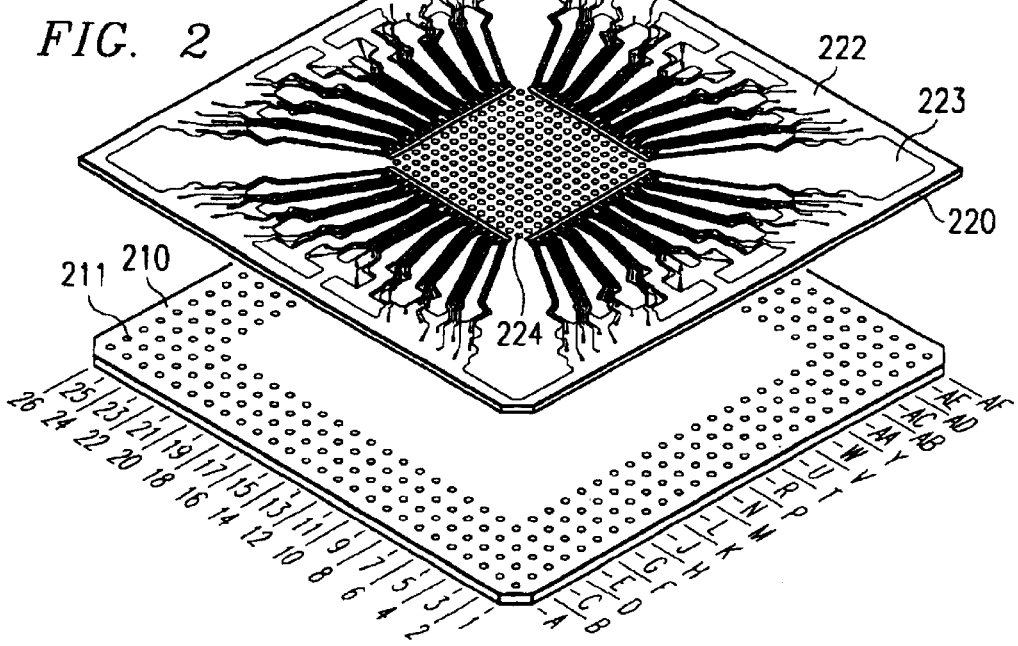
FIG. 2 is a simplified perspective view of the first and the second metal layers.
Figure 3:
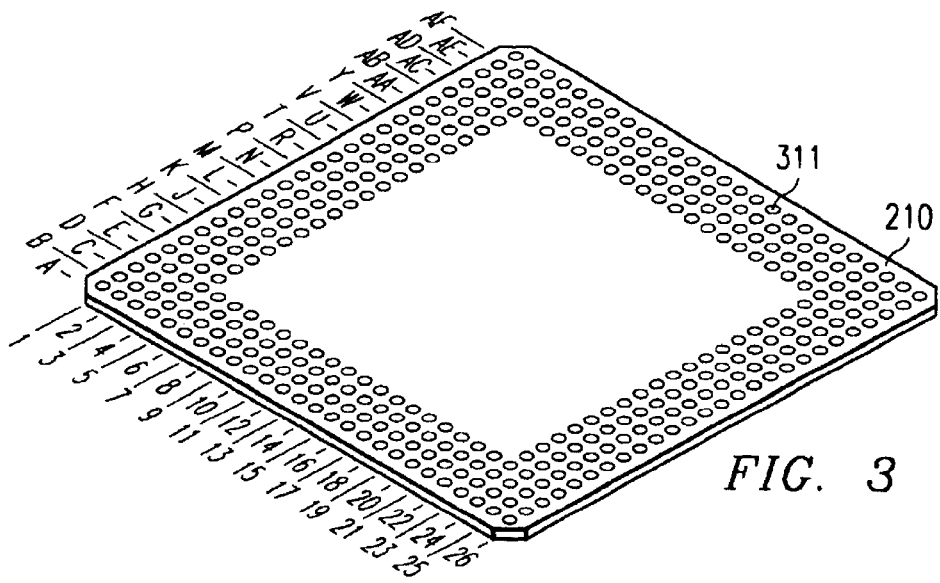
FIG. 3 is a simplified perspective view of the first metal layer as viewed from the bottom.

The relation and position of the two metal layers are shown in perspective view in FIGS. 2 and 3. Layer 210 is the first metal layer, providing the electrical ground potential. The plurality of openings is designated 211. When layer 210 is viewed perspectively from the underside, as illustrated in FIG. 3, a plurality of solder balls 311 is attached to the plurality of openings. Solder balls 311 establish the connections of the BGA to the outside world.

Referring now to FIG. 2, layer 220 is the second metal layer, providing the plurality of signal lines 221, first power lines 222 and second power lines 223. In the center of the second metal layer 220 is the flip-chip attach area 224, with the larger portion of the metal belonging to the second power lines. More detail is displayed in FIGS. 4 to 7.

Figure 4:
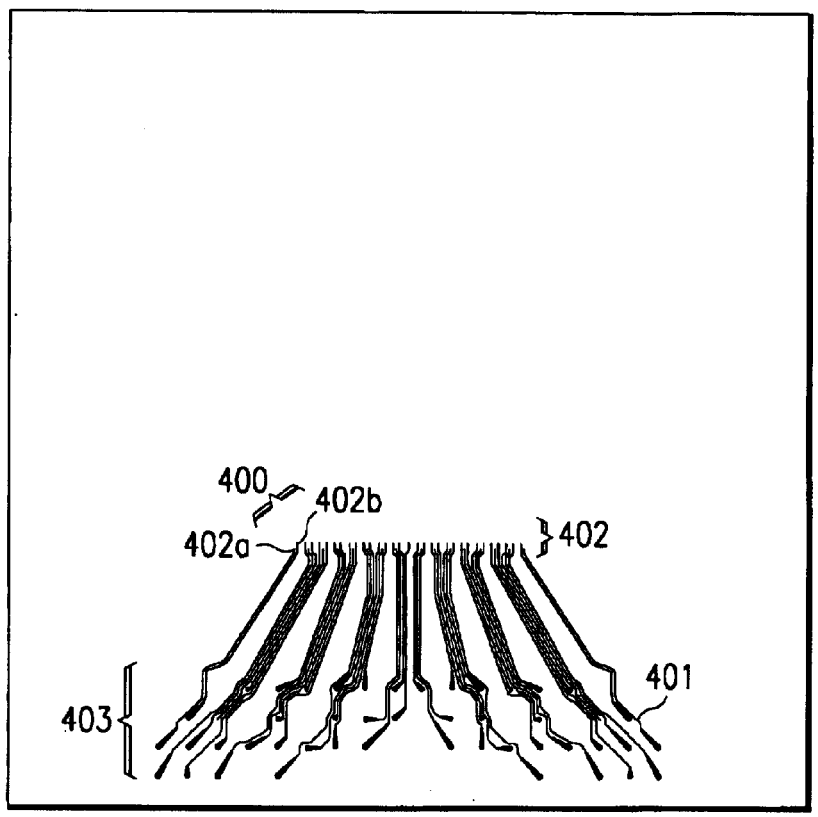
FIG. 4 is a simplified top view of a portion of the second metal layer, showing the structure of the signal lines.

FIG. 4 shows one quadrant, generally designated 400, of the signal line portion of the second metal layer 116. The total signal line portion has three additional quadrants of similar configuration. An individual signal line 401 has a width between 25 and 60 µm. One signal line is spaced to the adjacent signal line by insulating material of a width from about 20 to 50 µm. As FIG. 4 shows, the signal lines terminate at inner endpoints 402 close to the periphery of the chip-to-be-attached, preferably in two staggered rows 402a and 402b of staggered endpoints. The outer endpoints 403 fan out wide in order to serve a distributed array of solder ball connections.

Figure 5:
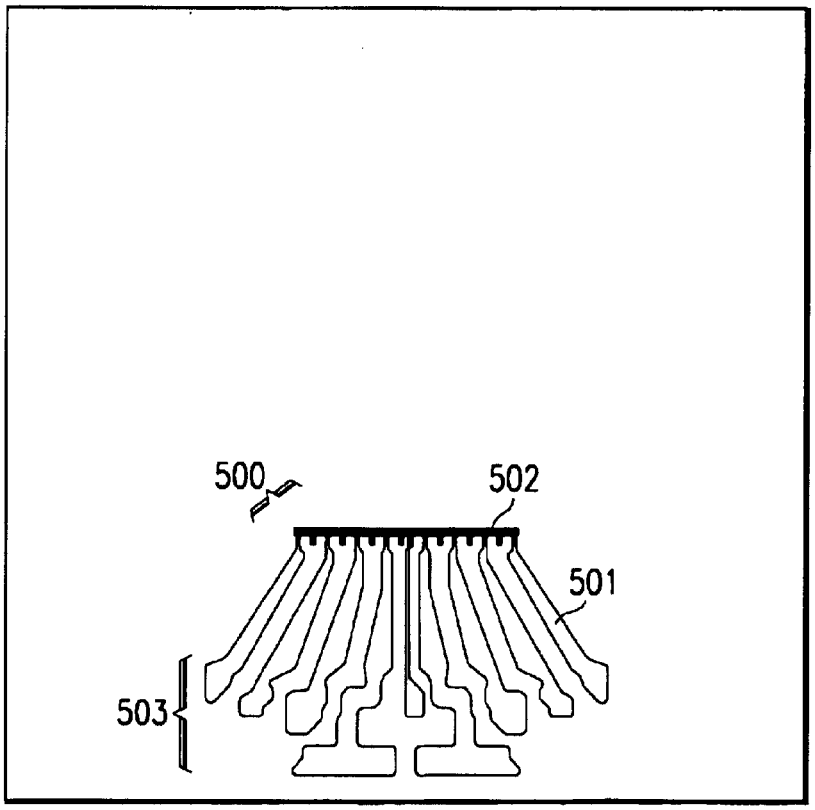
FIG. 5 is a simplified top view of a portion of the second metal layer, showing the structure of the first power lines.

FIG. 5 shows one quadrant, generally designated 500, of the portion of the first power lines of the second metal layer 116. The total portion of the first power lines has three additional quadrants of similar configuration. An individual power line 501 has a width from about 200 to 500 µm. It is an important aspect of the present invention that that the first power lines are configured so wide that their combined inductances approximate the inductance of a metal which would have the size of the total substrate. As FIG. 5 shows, the first power lines terminate at inner endpoints 502 close to the periphery of the chip-to-be-attached. The outer endpoints 503 fan out wide in order to serve a distributed array of solder ball connections. By way of example, the first power lines may be at an applied potential of 3.0 V.

It is further an important aspect of the present invention that the signal lines of FIG. 4 are positioned in a proximity of about 20 to 50 µm to the first power lines of FIG. 5, thus providing strong electromagnetic coupling, high mutual inductance and minimized effective self-inductance.

It is further an important aspect of the present invention that the signal lines are positioned to provide strong electromagnetic coupling to power and ground lines and thus minimal coupling, or cross-talk, between the signal lines.

It is further an important aspect of the present invention that the signal lines are distributed relative to the first power lines such that the inductive coupling between them reaches at least a minimum value, providing high mutual inductances and minimized effective self-inductance.

Figure 6:
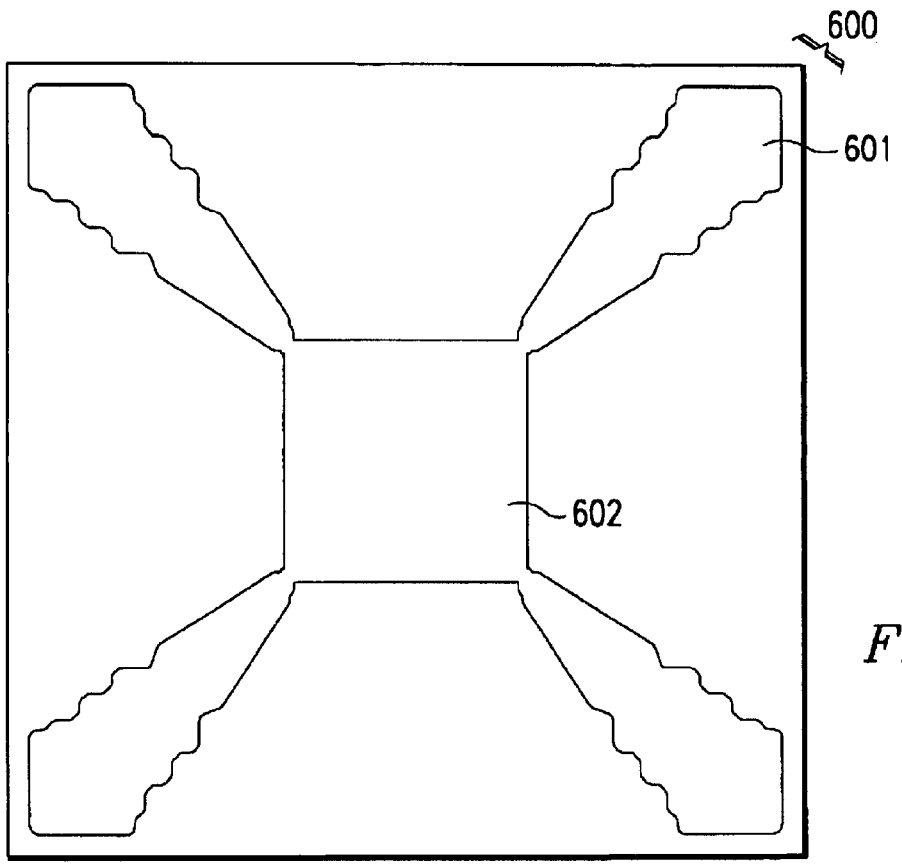
FIG. 6 is a simplified top view of a portion of the second metal layer, showing the structure of the second power lines.

FIG. 6 shows all four quadrants, generally designated 600, of the portion of the second power lines of the second metal layer. These second power lines are structured as distributed areas 601 having wide geometries for minimizing self-inductance; these areas may, for instance, utilize the four corners of the package. The second power lines merge into a central area 602 supporting a large number of chip solder bumps. By way of example, the second power lines may be at a 1.8 V applied potential.

Figure 7:
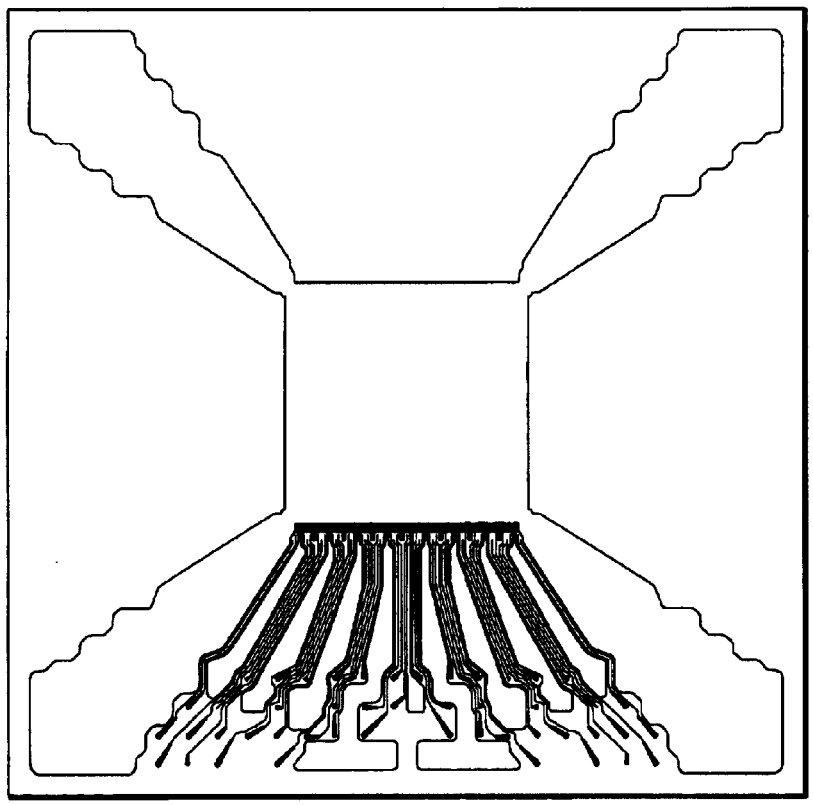
FIG. 7 is a simplified top view of the second metal layer showing the combined structures of signal lines, first power lines, and second power lines.
Figure 8:
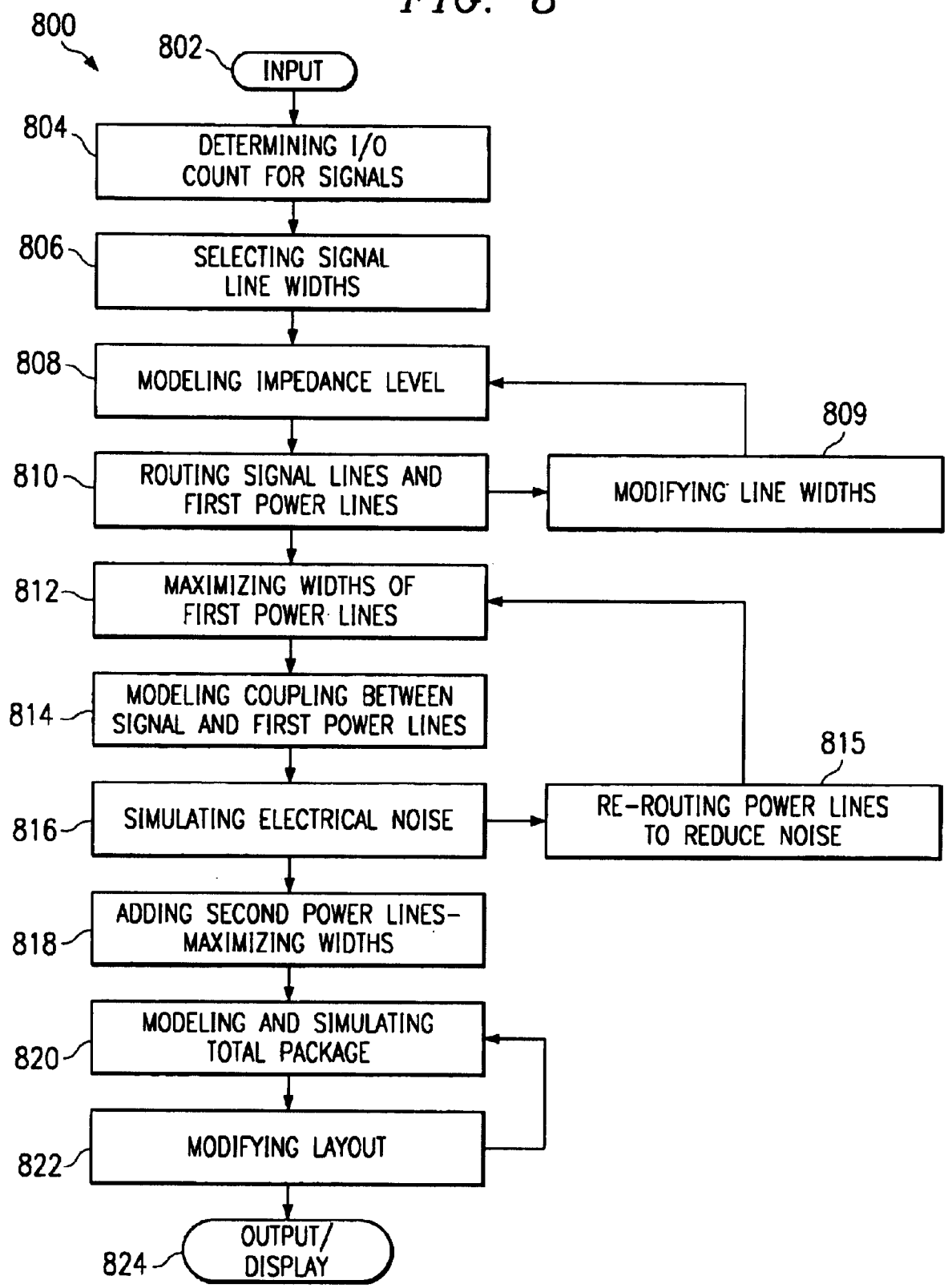
FIG. 8 is a flowchart illustrating an exemplary computer-implemented method for electrically modeling the structure of the metal and power lines according to the teachings of the present invention.

In FIG. 7, the three portions of the second metal layer, detailed in FIGS. 4, 5 and 6, are combined and displayed for one quadrant in order to illustrate the complex interrelated positioning of the signal lines, first power lines, and second power lines according to the invention. The three remaining quadrants of the first metal structures, not shown in FIG. 7, are analogous to the one quadrant shown relative to the combination of signal and first power lines. FIG. 8 is a flowchart illustrating an exemplary computer-implemented method 800 for modeling a high-performance, high I/O ball grid array substrate for IC flip-chip assembly according to the teachings of the present invention. Method 800 begins at step 802 by collecting the inputs of a first and a second metal layer, all of substantially equal areas. The first metal layer provides electrical ground potential.

The majority of the modeling concerns the three portions of the second metal layer. The method proceeds next to step 804 where the I/O count of the signal lines of the second metal layer is determined. With the I/O input at step 806, the widths and layout of the signal lines are selected. Based on this selection, the resulting impedance levels of the signal lines are modeled at step 808. Further, the signal lines are electromagnetically coupled to the ground potential applied to the first metal layer; using this coupling, the cross talk between the signal lines is modeled with the goal of minimizing the cross talk.

At step 810, details of the first power lines (operable at a first electrical potential, for instance 3.0 V) of the second metal layer are added to the modeling. The plurality of the signal lines is routed in conjunction with the plurality of the first power lines with the goal of providing at least a minimum inductive coupling between signal and power lines. This goal strives to obtain high mutual inductance and to minimize effective self-inductance. If the result of this modeling step is not satisfactory, the widths of the signal lines are modified in step 809. They are fed back as improved inputs to step 808 in order to repeat the impedance modeling, and then to step 810 in order to repeat the signal and power lines routing and distribution.

After completing the relative positioning of signal and first power lines, achieving high mutual inductances and minimized effective self-inductance, the widths of the first power lines are maximized in step 812. The goal is to configure the first power lines so wide that their combined inductances approximates the inductance of a metal having the area size of the total substrate.

At steps 814 and 816, the coupling between signal lines and first power lines is further modeled, especially by simulating electrical noise. If the relative line distribution does not exhibit enough insensitivity or suppression of noise, the first power lines are rerouted relative to the signal lines to reduce noise (step 815). The rerouted line distribution is fed back to step 812 as a revised input for maximizing the widths of the first power lines.

At step 818, the plurality of second power lines (operable at a second electrical potential, for instance 1.8 V) of the second metal layer is added to the modeling. The second power lines are modeled to serve as distributed areas having wide geometries so that self-inductance is minimized. The second power lines merge into a central area, which serves to support the IC chip. The maximized widths of the second power lines are used as inputs for step 820, the modeling and simulation of the total package.

Additional inputs for step 820 are the structure, thickness, and material characteristics of the insulating layer positioned between the first and second metal layers. The goal of the modeling is to provide strong electromagnetic coupling between the signal lines and the first metal layer in order to reach a predetermined impedance to ground (for instance, 50 ohms) and to minimize cross talk between signal lines.

If these goals are not achieved satisfactorily, the layout of signal lines and first and second power lines are modified in step 822 and the new layout is fed back as improved input to the modeling of the total package in step 820. The final output of the electrical modeling is displayed in step 824, which ends method 800.

Figure 9:
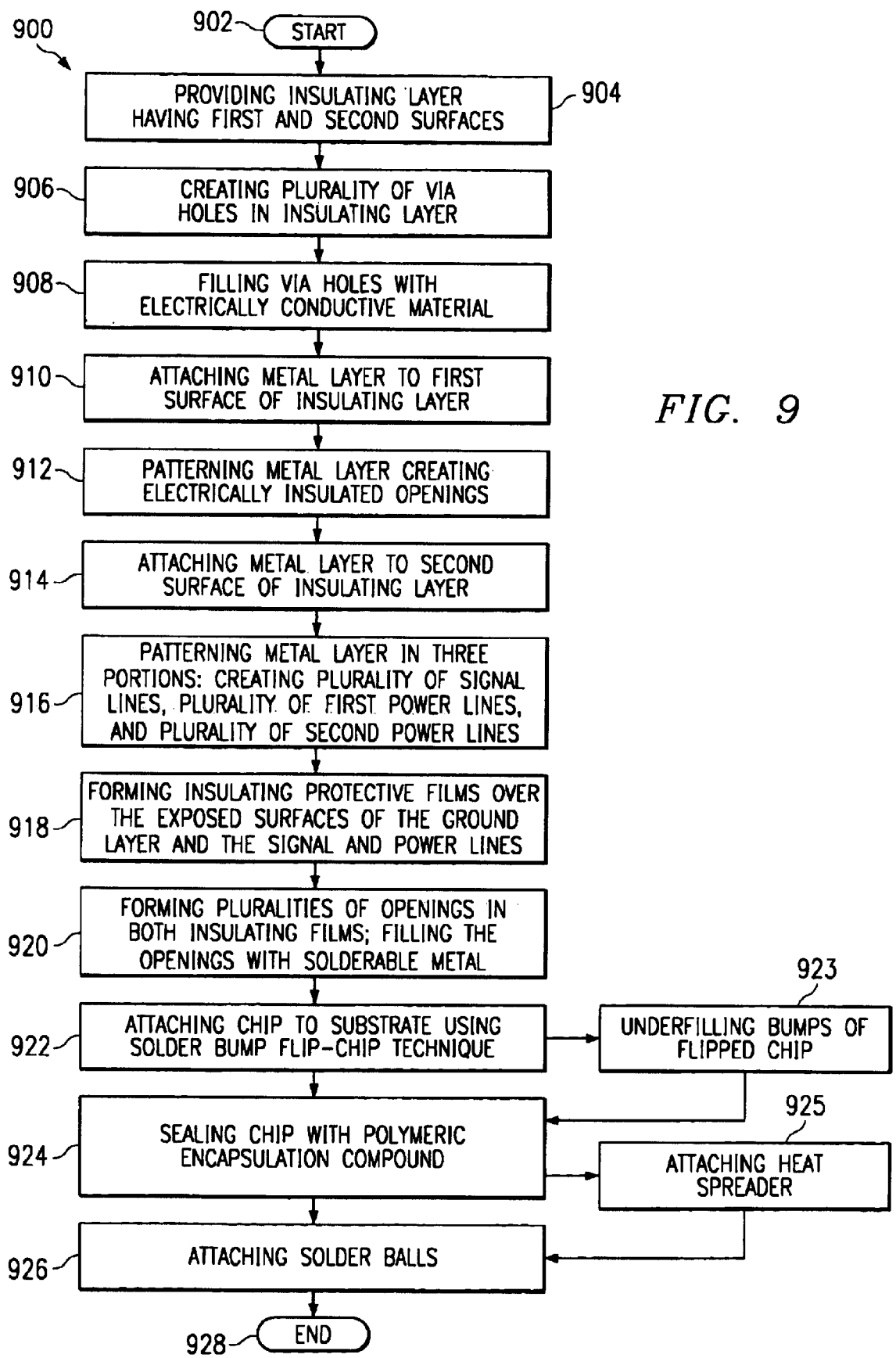
FIG. 9 is a flowchart illustrating an exemplary method for forming a ball grid array package substrate according to the teachings of the present invention.

FIG. 9 is a flowchart illustrating an exemplary method 900 for fabricating a high-performance, high I/O ball grid array substrate for IC flip-chip assembly, having two patterned metal layer and one intermediate insulating layer, according to the teachings of the present invention. Method 900 begins at step 902 and proceeds next to step 904 where an insulating layer is provided that has a first surface and a second surface. Suitable materials include polyimides, epoxy glass (FR-4, FR-5, or BT), or other flexible electrically non-conductive materials; thickness usually in range 70 to 150 $\mu$m.

At step 906, the insulating layer of the substrate is patterned to form a plurality of via holes using mechanical drilling or a laser beam technique. At step 908, the via holes are filled with metal, such as copper, or other electrically conductive material, creating a plurality of electrically conductive vias through the insulating layer of the substrate.

At step 910, one of the two metal layers (preferably copper, thickness between 7 to 15 $\mu$m) is attached to the first surface of the insulating layer (using typically a roll-on process). This metal layer is intended to provide electrical ground potential in the BGA. The patterning of this metal layer, using standard photo-lithographic techniques, to form a plurality of electrically insulated openings intended for outside electrical contacts, such as solder balls, is performed at step 912.

At step 914, the other of the two metal layers (preferably copper, thickness between 7 to 15 $\mu$m) is attached to the second surface of the: insulating layer (using typically a roll-on process). This metal layer is intended to provide three functions in three patterned portions. The patterning of this metal layer in step 916, using standard photo-lithographic techniques, creates the plurality of signal lines; the plurality of first power lines, providing a specific electrical potential; and the plurality of second power lines, providing another specific electrical potential. Selected signal and power lines are in electrical contact with the vias in the insulating layer.

At step 918, insulating protective films are formed over the exposed surface of the ground layer and over the exposed surfaces of the signal and power lines. At step 920, pluralities of openings are formed in both insulating films; these openings are then filled with solderable metal (for instance, copper with gold flash), creating attachment sites for outside solder balls used in board attach, and for chip solder bumps used in flip-chip assembly. The fabrication of the BGA substrate is thus completed.

In order to finish the fabrication of the BGA package, method 900 continues at step 922 by attaching an IC chip to the substrate. The chip has an active surface including solder bumps. These bumps are adhered to the plurality of metal-filled openings in the outermost insulating film protecting the signal and power lines. The solder reflow typically involves the temperature of the eutectic tin/lead mixture.

The process flow chart continues at step 924 or, if needed, at step 923. At step 923, any gaps are filled between the substrate and the chip left void after the chip solder bumps have been adhered to the plurality of openings in the outermost insulating film protecting the signal and power lines. As filling material, a polymeric encapsulant is commonly used made of an epoxy-based precursor filled with silica and anhydrides, requiring elevated temperatures for curing.

At step 924, the chip (more precisely, the passive surface of the chip and its four edge sides) is surrounded with a polymeric encapsulation compound; preferably, a transfer molding process is used.

Due to the short thermal paths for heat dissipation, the thermal characteristics of the BGA of the invention are excellent. If further improvement is required, a heat slug can be attached in step 925; it is preferably positioned on the outer surface of the cured encapsulation material.

At step 926, solder balls are attached to the plurality of metal-filled openings in the outermost insulating film protecting the ground layer. This process provides external electrical and mechanical connections to the BGA package. Generally, the solder balls will be arrayed in a rectangular pattern around the periphery of the BGA package; a multitude of balls may also be positioned in the center of the package. Method 900 ends at step 928.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the BGA may have an encapsulation made by overmolding or another technique, or may have no encapsulation of the flip-soldered chip at all. As another example, instead of the encapsulation using molding compounds, a thermally conductive lead may be attached over the flip-soldered chip for physical protection and thermal enhancement. As another example, the two metal layers may be attached to the surfaces of the insulating layer concurrently and then patterned individually, rather than being attached and patterned sequentially. It is therefore intended that the appended claims encompass any such modifications or embodiments.

We claim:

1. A high-performance, high I/O ball grid array substrate, designed for integrated circuit flip-chip assembly and having two patterned metal layers, comprising:

an insulating layer having a first surface, a second surface and a plurality of vias filled with metal;

said first surface having one of said metal layers attached to provide electrical ground potential, and having a plurality of electrically insulated openings for outside electrical contacts;

an outermost insulating film protecting the exposed surface of said ground layer, said film having a plurality of openings filled with metal suitable for solder ball attachment;

said second surface having the other of said metal layers attached, portions thereof being configured as a plurality of electrical signal lines, further portions as a plurality of first electrical power lines, and further portions as a plurality of second electrical power lines, selected signal and power lines being in contact with said vias;

said signal lines being distributed relative to said first power lines such that the inductive coupling between them reaches at least a minimum value, providing high mutual inductances and minimized effective self-inductance;

said signal lines further being electromagnetically coupled to said ground metal such that cross-talk between signal lines is minimized; and an outermost insulating film protecting the exposed surfaces of said signal and power lines, said film having a plurality of openings filled with metal suitable for contacting selected signal and power lines and chip solder bumps.

2. The substrate according to claim 1 wherein the number of said I/O's ranges from about 100 to about 600.

3. The substrate according to claim 1 wherein the thickness of said substrate is in the range from about 150 to 300 $\mu$m.

4. The substrate according to claim 1 wherein said signal lines have a width between about 25 to 60 $\mu$m and are spaced to an adjacent line by insulating material of about 20 to 50 $\mu$m width.

5. The substrate according to claim 1 wherein said first power lines have a width from about 200 to 500 $\mu$m.

6. The substrate according to claim 1 wherein said signal lines are positioned in a proximity of about 20 to 50 $\mu$m to said first power lines, thus providing strong electromagnetic coupling, high mutual inductance and minimized effective self-inductance.

7. The substrate according to claim 1 wherein said signal lines are positioned to provide strong electromagnetic coupling to power and ground lines and thus minimal coupling, or cross-talk, between said signal lines.

8. The substrate according to claim 1 wherein said patterned metal layers are selected from a group consisting of copper, brass, aluminum, silver, or alloys thereof, and have a thickness in the range from about 7 to 15 $\mu$m.

9. The substrate according to claim 1 wherein said insulating layer is made of organic material and is selected from a group consisting of polyimide, polymer strengthened by glass fibers, FR-4, FR-5, and BT resin;

said insulating layer having a thickness between about 70 and 150 $\mu$m.

10. The substrate according to claim 1 wherein said vias are filled with copper, tungsten, or any other electrically conductive material.

11. The substrate according to claim 1 wherein said second power lines art structured as distributed areas having wide geometries for minimizing self-inductance and merging into a central area supporting said chip.

12. The substrate according to claim 1 wherein said outermost insulating films are glass-filled epoxies, polyimides, acrylics or other photo-imageable materials, suitable as solder masks and have a thickness between about 50 and 100 $\mu$m.

13. The substrate according to claim 1 wherein said openings for solder bump and solder ball attachments are made of copper including a flash of gold or palladium, or other wettable and solderable metals.

14. A high-performance, high I/O ball grid array package comprising:

a substrate having two patterned metal layers, comprising;

an insulating layer having a first surface, a second surface and a plurality of vias filled with metal;

said first surface having one of said metal layers attached to provide electrical ground potential, and having a plurality of electrically insulated openings for outside electrical contacts;

an outermost insulating film protecting the exposed surface of said ground layer, said film having a plurality of openings filled with metal suitable for solder ball attachment;

said second surface having the other of said metal layers attached, portions thereof being configured as a plurality of electrical signal lines, further portions as a plurality of first electrical power lines, and further portions as a plurality of second electrical power lines, selected signal and power lines being in contact with said vias;

said signal lines being distributed relative to said first power lines such that the inductive coupling between them reaches at least a minimum value, providing high mutual inductances and minimized effective self-inductance;

said signal lines further being electromagnetically coupled to said ground metal such that cross-talk between signal lines is minimized; and an outermost insulating film protecting the exposed surfaces of said signal and power lines, said film having a plurality of openings filled with metal suitable for contacting selected signal and ground lines and chip solder bumps;

an integrated circuit chip having an active surface including solder bumps, said solder bumps adhered to said plurality of openings in said outermost insulating film protecting said signal and power lines; and solder balls attached to said plurality of openings in said outermost insulating film protecting said ground layer.

15. The package according to claim 14 further comprising a polymeric encapsulant filling any gaps between said chip and said substrate, left void after said chip solder bumps are adhered to said plurality of openings in said outermost insulating film protecting said signal and power lines.

16. The package according to claim 15 wherein said polymeric encapsulant is a polymeric precursor made of an epoxy base material filled with silica and anhydrides, requiring thermal energy for curing to form a polymeric encapsulant.

17. The package according to claim 14 further comprising an encapsulation material surrounding said chip.

18. The package according to claim 17 wherein said encapsulation material is a polymeric material selected from a group consisting of epoxy-based molding compounds suitable for adhesion to said chip, and fluoro-dielectric compounds supporting high-speed and high-frequency package performance.

19. The package according to claim 17 further comprising an optional heat spreader positioned on the outer surface of said encapsulation material.

20. The package according to claim 14 wherein said chip solder bumps comprise attach materials selected from a group consisting of tin, lead/tin alloys, indium, indium/tin alloys, solder paste, and conductive adhesive compounds.

21. The package according to claim 14 wherein said solder balls comprise attach materials selected from a group consisting of tin/lead, tin/indium, tin/silver, tin/bismuth, solder paste, and conductive adhesive compounds.

22. The package according to claim 14 wherein the thickness of said package is in the range from about 250 to 800 $\mu$m, excluding the thickness of the heat slug.

23. A packaged integrated circuit, comprising:
a substrate having first and second opposing surfaces, said substrate having;
a plurality of signal lines, a plurality of first power lines coupleable to a first power source, and a plurality of second power lines coupleable to a second power source, all on said second surface, at least one of said plurality of signal lines disposed between a pair of said plurality of first power lines, and said signal lines between said pair of said plurality of first power lines and said pair of said plurality of first power lines disposed between a pair of said second power lines;
an integrated circuit chip mounted on said substrait; and
wherein said signal lines are of a first width, said first power lines are of a second width different from said first, and said second lines are of a third width different from said first and second widths;
wherein said third width is wider than said second width, and said second width is wider than said first width.

24. The integrated circuit of claim 23, further comprising a ground plane on said first surface of said substrate.

25. A packaged integrated circuit, comprising:
a substrate having first and second opposing surfaces, said substrate having thereon:
a plurality of groups of lines, said plurality of groups of lines including groups of lines of at least three different widths disposed on said second surface of said substrate, said groups of lines arranged such that one or more lines in a first group of lines of a first width are disposed between lines of a second group of lines of a second width and lines in a said second group of lines of said second width are disposed between lines of said third width; and
an integrated circuit chip mounted on said substrate and coupled to at least some of said lines; and
wherein said lines of said first width are signal lines, said lines of said second width are power lines coupled to a first voltage potential, and said lines of said third width are power lines coupled to a second voltage potential;
wherein said third width is wider than said second width, and said second width is wider than said first width.

26. The integrated circuit of claim 25, further comprising a ground plane on said first surface of said substrate.

27. A packaged integrated circuit, comprising:
a substrate having first and second opposing surfaces, said substrate having:
a plurality of signal lines, a plurality of first power lines coupled to a first power source, and a plurality of second power lines coupled to a second power source, all on said second surface, at least one of said plurality of signal lines disposed between a pair of said plurality of first power lines, and said signal lines between said pair of said plurality of first power lines and said pair of said plurality of first power lines disposed between a pair of said second power lines; and
an integrated circuit chip mounted on said substrate; and
wherein said signal lines are of a first width, said first power lines are of a second width different from said first, and said second lines are of a third width different from said first and second widths;
wherein said third width is wider than said second width, and said second width is wider than said first width.

* * * * *